(12) United States Patent
Yim et al.

(10) Patent No.: US 10,014,654 B2
(45) Date of Patent: Jul. 3, 2018

(54) OPTOELECTRONIC PACKAGING ASSEMBLIES

(71) Applicant: Intel Corporation, Santa Clara, CA (US)

(72) Inventors: Myung Jin Yim, San Jose, CA (US); Ansheng Liu, Cupertino, CA (US); Valentin Yepanechnikov, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/100,265

(22) PCT Filed: Dec. 27, 2013

(86) PCT No.: PCT/US2013/078092
§ 371 (c)(1),
(2) Date: May 27, 2016

(87) PCT Pub. No.: WO2015/099781
PCT Pub. Date: Jul. 2, 2015

(65) Prior Publication Data
US 2017/0005453 A1    Jan. 5, 2017

(51) Int. Cl.
*H01L 31/02* (2006.01)
*H01L 31/12* (2006.01)
(Continued)

(52) U.S. Cl.
CPC ...... *H01S 5/02236* (2013.01); *H01L 31/0232* (2013.01); *H01S 5/0226* (2013.01);
(Continued)

(58) Field of Classification Search
CPC .......... H01L 23/12; H01L 21/56; H01L 31/02
(Continued)

(56) References Cited

U.S. PATENT DOCUMENTS

| 6,512,861 | B2 * | 1/2003 | Chakravorty | G02B 6/42 |
| | | | | 385/14 |
| 6,686,216 | B2 * | 2/2004 | Trezza | H01L 25/0753 |
| | | | | 257/E25.02 |

(Continued)

FOREIGN PATENT DOCUMENTS

| CN | 101180562 A | 5/2008 |
| CN | 103026279 A | 4/2013 |

(Continued)

OTHER PUBLICATIONS

International Preliminary Report on Patentability, PCT/US2013/078092, dated Jul. 7, 2016, 7 pages.
(Continued)

*Primary Examiner* — Sheikh Maruf
(74) *Attorney, Agent, or Firm* — Compass IP Law PC (57) ABSTRACT

Optoelectronic packaging assemblies are provided that are useful for optical data, transfer In high performance computing applications, board to board in data centers, memory to CPU, switch/FPGA (field programmable gate array) for chip to chip interconnects, and memory extension. The packaging assemblies provide fine pitch flip chip interconnects and chip stacking assemblies with good thermomechanical reliability. Underfill dams and optical overhang regions and are provided for optical interconnection.

19 Claims, 7 Drawing Sheets

(51) Int. Cl.
    *H01L 33/00*     (2010.01)
    *H01S 5/022*     (2006.01)
    *H01S 5/18*     (2006.01)
    *H01L 31/0232*     (2014.01)
    *H01S 5/024*     (2006.01)
    *H01L 21/56*     (2006.01)

(52) U.S. Cl.
    CPC .............. *H01S 5/18* (2013.01); *H01L 21/563* (2013.01); *H01L 2224/16225* (2013.01); *H01L 2924/0002* (2013.01); *H01S 5/02476* (2013.01)

(58) Field of Classification Search
    USPC ........................ 257/433, 81, 82, 737; 438/23
    See application file for complete search history.

(56) References Cited

U.S. PATENT DOCUMENTS

| | | | |
|---|---|---|---|
| 6,736,553 B1* | 5/2004 | Stiehl ................... | G02B 6/4246 385/89 |
| 8,796,843 B1* | 8/2014 | Babic ..................... | H01L 24/17 257/694 |
| 9,117,808 B2 | 8/2015 | Toh et al. | |
| 9,335,473 B2 | 5/2016 | Lai et al. | |
| 2002/0168168 A1* | 11/2002 | Iravani ................. | G02B 6/4452 385/135 |
| 2004/0212069 A1 | 10/2004 | Chen et al. | |
| 2005/0058408 A1* | 3/2005 | Colgan ................ | G02B 6/4214 385/89 |
| 2005/0207458 A1* | 9/2005 | Zheng ................. | H01S 5/02212 372/34 |
| 2006/0120660 A1* | 6/2006 | Rolston ................ | G02B 6/421 385/15 |
| 2006/0220259 A1 | 10/2006 | Chen et al. | |
| 2006/0251140 A1 | 11/2006 | Lee | |
| 2007/0007643 A1* | 1/2007 | Oh .................... | H01L 23/49827 257/701 |
| 2007/0297729 A1* | 12/2007 | Kodama ................. | G02B 6/42 385/94 |
| 2008/0247703 A1* | 10/2008 | Kodama ............. | G02B 6/4204 385/14 |
| 2009/0065791 A1* | 3/2009 | Yen ...................... | H01L 33/507 257/98 |
| 2009/0236729 A1* | 9/2009 | Fann ..................... | C22C 12/00 257/692 |
| 2010/0032784 A1* | 2/2010 | Takasaki ................ | H01L 23/60 257/434 |
| 2010/0033647 A1* | 2/2010 | Okita ..................... | H04N 5/2253 349/57 |
| 2010/0046569 A1* | 2/2010 | Kim .................... | H01S 5/02252 372/50.12 |
| 2011/0148312 A1* | 6/2011 | Zhang ................. | H05B 33/0806 315/185 R |
| 2011/0216998 A1* | 9/2011 | Symington .......... | G02B 3/0075 385/14 |
| 2012/0025209 A1 | 2/2012 | Kim et al. | |
| 2012/0089180 A1* | 4/2012 | Fathi ................... | B41J 2/17559 606/214 |
| 2012/0183253 A1* | 7/2012 | Yasuda ................ | G02B 6/4214 385/14 |
| 2012/0248482 A1* | 10/2012 | Lin ...................... | H01L 33/486 257/98 |
| 2013/0272649 A1* | 10/2013 | Braunisch ............... | G02B 6/12 385/14 |
| 2014/0042481 A1* | 2/2014 | Inoue ..................... | H01L 33/46 257/98 |
| 2014/0239481 A1 | 8/2014 | Nguyen et al. | |
| 2014/0312489 A1 | 10/2014 | Im et al. | |
| 2015/0087086 A1* | 3/2015 | Yoshida ................ | H01L 25/042 438/14 |
| 2015/0153524 A1* | 6/2015 | Chen ................... | G02B 6/4228 385/14 |
| 2015/0262983 A1* | 9/2015 | Krabe .................. | H01L 25/167 250/214.1 |
| 2016/0141328 A1* | 5/2016 | Takemoto ......... | H01L 27/14634 257/433 |

FOREIGN PATENT DOCUMENTS

| | | |
|---|---|---|
| CN | 103097932 A | 5/2013 |
| JP | 2000040840 | 2/2000 |
| JP | 2002343983 | 11/2002 |
| JP | 2004235547 A | 8/2004 |
| JP | 2007184400 | 7/2007 |
| JP | 2007207805 | 8/2007 |
| JP | 2008523581 | 7/2008 |
| JP | 2010087516 A | 4/2010 |
| JP | 2011033659 A | 2/2011 |
| JP | 2012145743 A | 8/2012 |
| JP | 2013532850 A | 8/2013 |
| KR | 1020080077177 A | 8/2008 |

OTHER PUBLICATIONS

Organized Translation of "Notice of Reasons for Rejection" for Japanese Patent Application No. 2016-533576, dated Feb. 14, 2017, 4 pages.
International Search Report and Written Opinion for PCT Patent Application No. PCT/US13/78092, dated Sep. 26, 2014. 10 pages.
English Translation of Japan Office Action, Patent Application No. 2016-533576, dated Jun. 6, 2017, 2 pages.
English Translation of the Notice of Preliminary Rejection, Patent Application No. 2016-7013998, dated Jun. 9, 2017, 4 pages.
Notice of Allowance for Japanese Patent Application No. 2016-533576, dated Sep. 14, 2017, 4 pages.
Chinese Office Action and Search Report of P.R. China State Intellectual Property Office for Patent Application No. 201380081242.1, dated Jan. 4, 2018, 10 pages.
Extended European Search Report for Patent Application No. 13900353.7, dated Aug. 22, 2017, 6 pages.

* cited by examiner

OPTOELECTRONIC PACKAGING ASSEMBLIES

CLAIM OF PRIORITY

This application is a U.S. National Phase application under 35 U.S.C. § 371 of International Application No. PCT/US13/78092, filed Jan. 8, 2014, entitled "OPTOELECTRONIC PACKAGING ASSEMBLIES" the entire contents of which are incorporated herein by reference.

FIELD OF THE INVENTION

Embodiments of the invention relate generally to optoelectronic packaging assemblies, semiconductor device stacking assemblies, optical transceiver modules, and optical data transfer and communication.

BACKGROUND INFORMATION

The transition from electrical data transmission to optical data transmission between and among computers, chips, server boards, servers, and devices provides significant improvements in bandwidth and distance over which a signal can be sent, but it presents challenges in areas such as thermal management, materials compatibility, optical alignment, and cost effectiveness. Assemblies incorporating hybrid lasers are being created that provide bandwidths of 100 Gbps for input/output between server racks combining compute, storage, and networking resources. These assemblies require that the optical transceiver modules be packaged in a manner that meets challenging performance demands. In general, the package for the semiconductor chip protects the chip from damage and supplies electronic connections that connect the semiconductor chip to power supplies and other electronic components (performing, for example, input/output functions). As semiconductor chips trend toward higher bandwidth performance and end users need smaller form factors, the packaging of optoelectronic devices must meet size, thermal management, power delivery, interconnect density, cost, alignment, and integration challenges.

BRIEF DESCRIPTION OF THE FIGURES

The material described and illustrated herein is provided for purposes of exemplifying aspects of the invention and is not meant to be limiting of the scope of the invention. For simplicity and clarity of illustration, elements illustrated in the figures are not necessarily drawn to scale. Further, where appropriate, reference labels have been repeated among figures to indicate corresponding or analogous elements. In the figures.

DETAILED DESCRIPTION OF THE INVENTION

In the following description, specific details are presented to provide an understanding of embodiments of the invention. Embodiments may be practiced without one or more of these specific details and frequently specific details of one embodiment may be practiced with other disclosed embodiments, as will be apparent to one of skill in the art. In other instances, well-known features are not described in detail in order to not obscure the description.

Optoelectronic packaging assemblies described herein are useful, for example, for optical data transfer in high performance computing applications, board to board in data centers, memory to CPU, switch/FPGA (field programmable gate array) for chip to chip interconnects, and memory extension. Embodiments of the invention provide small form factors, lowered costs, and improved reliability for optical data transfer.

Figure 1A:
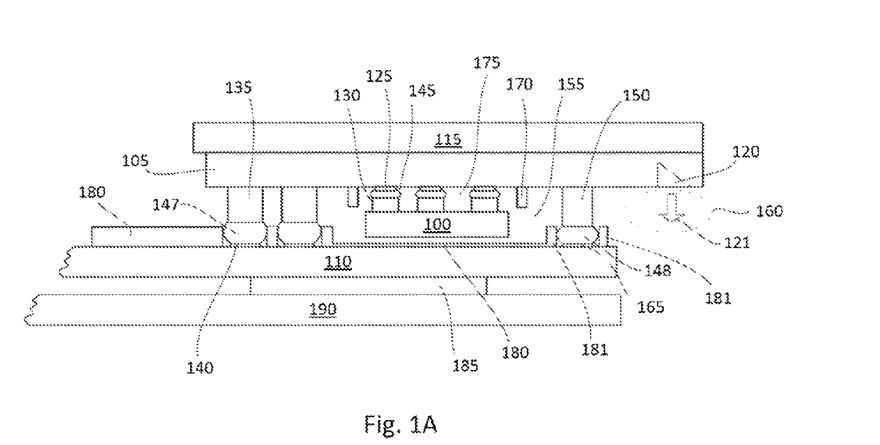
FIGS. 1A-B are schematic diagrams illustrating views of an optoelectronic stacking packaging assembly employing an underfill dam.

FIG. 1A provides an optoelectronic packaging assembly in which an IC (integrated circuit) chip 100 is directly flip-chip bonded to a laser chip 105. In embodiments of the invention, the IC (integrated circuit) chip 100 (or die) is not directly bonded to the packaging substrate 110. The IC chip 100 is a driver for laser chip 105. In embodiments IC chip 100 is a distributed driver and is capable of driving a plurality of optical modulators (not shown) in the laser chip 105 that can modulate a laser beam. In further embodiments of the invention, the driver IC chip 100 is a thinned die and has, for example, a thickness of 50±10 µm (about 50 µm) in its smallest dimension. Additionally, the driver IC chip 100 can be thinned to 50 µm or less in height or between 100 µm and 20 µm in height. Optionally, a thermal management component 115, such as a heat spreader or heat sink, is in thermal contact with a surface of the laser chip 105. Optionally, a layer of a material, such as a thermal interface material (not shown), is between the thermal management component 115 and the laser chip 105. Optionally, the laser chip 105 comprises optical components 120 that steer light 121 out of the laser chip 105. Optical components 120 direct laser light from laser chip 105 and can be optics that turn the light 90 degrees, such as 45 degree mirrors. Electrically conducting pillars, bumps, pins, or posts 125 on laser chip 105 join up with corresponding electrically conducting pillars, bumps, pins, or posts 130 on driver chip 100 and electrically operably couple laser chip 105 with driver chip 100. Conducting pillars, bumps, pins, or posts 135 on laser chip 105 join up with conducting pillars, bumps, pins, or posts 140 on the packaging substrate 110 and operably electrically couple laser chip 105 with substrate 110. Conducting pillars, bumps, pins, or posts 125 and 135 are electrically connected and joined with corresponding conducting pillars, bumps, pins, or posts 130 and 140, respectively, through optional solder material 145 and 147. In alternate embodiments, no solder material 145 and 147 is present and the conducting pillars, bumps, pins, or posts 125 and 135 are electrically connected and joined with corresponding conducting pillars, bumps, pins, or posts 130 and 140, respectively, through a thermocompression bonding, thermosonic bonding, and/or epoxy bonding process, for example.

The surface of laser chip 105 also comprises a chip-on-substrate dam 150. An underfill 155 is placed between substrate 110 and laser chip 105. Chip-on-substrate dam 150 aids in preventing the flow of underfill 155 into the optical overhang area 160 of laser chip 105 during an underfill fill process, such as, for example, a capillary underfill process. Chip-on-substrate dam 150 is optionally bonded to a corresponding metal region 165 of packaging substrate 110 through, for example, solder material 148. Other bonding materials are possible. Optional metal region 165 is not operably electrically connected to packaging substrate 110.

In additional embodiments, the surface of the laser chip 105 comprises a chip-on-chip dam 170. An underfill layer 175 is placed between laser chip 105 and IC chip 100. The chip-on-chip dam 170 aids in preventing the flow of underfill 175 into unwanted areas during an underfill fill process, such as, for example, a capillary underfill process Optionally, packaging substrate 110 comprises a passivation layer 180 on a surface. Passivation layer 180 can comprise features 181 that provide boundaries for solder material and underfill layers. Features 181 can be, for example, raised regions, bumps, or pillars.

A connector 185 connects the package substrate 110 to board 190. The connector 185 is, for example, an electrical connector that allows the optoelectronic assembly package to be removably attached to the board 190, such as a low insertion force (LIF) connector or a socket connector. Board 190 provides electrical connections to other IC devices, such as, for example, processors and/or memory and is, for example a printed circuit board or other type of motherboard or server board.

Figure 1B:
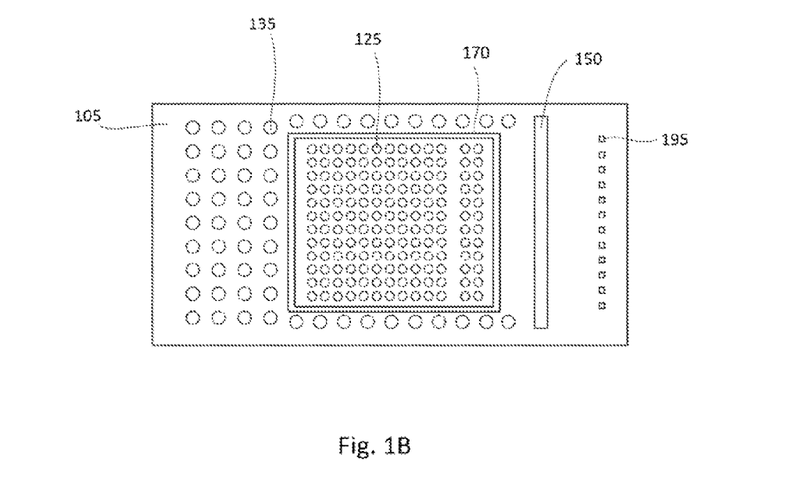

FIG. 1B is a view of a side of the laser chip 105 and the view does not include the IC chip 100 and the packaging substrate 110. In the view of FIG. 1B a larger number of conducting pillars 135 that join up with conducting posts 140 on the packaging substrate 110 have been provided. Additionally, in the view of FIG. 1B a larger number of conducting pillars 125 that join up with conducting posts 130 on the IC chip 100 have been provided. Other numbers conducting pillars 125 and 135 are also possible. The chip-on-substrate dam 150 and the chip-on-chip dam 170 are also visible in FIG. 1B. Optical transmission holes 195 allow laser light to exit laser chip 105. In embodiments of the invention, optical transmission holes 195 are vertically inverted taper holes.

Figure 2A:
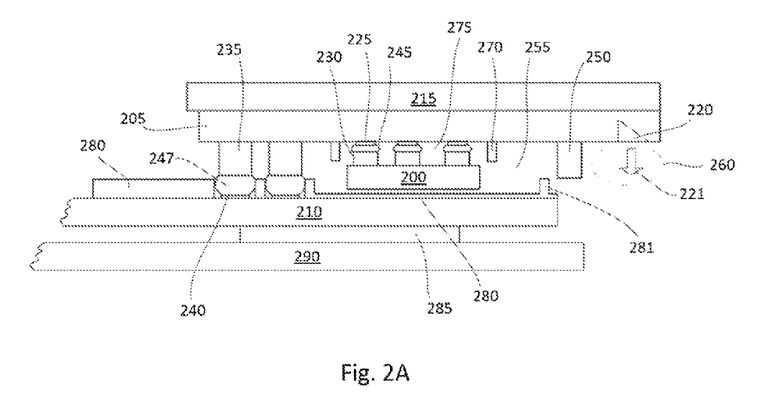
FIGS. 2A-B are schematic diagrams illustrating views of an additional optoelectronic stacking packaging assembly employing an underfill dam.

FIG. 2A illustrates an additional optoelectronic packaging assembly in which an IC chip 200 is directly flip-chip bonded to a laser chip 205. In embodiments of the invention, the IC chip 200 is not directly bonded to the packaging substrate 210. The IC chip 200 is a driver for laser chip 205. In embodiments IC chip 200 is a distributed driver and is capable of driving a plurality of optical modulators (not shown) that can modulate a laser beam in the laser chip 205. In further embodiments of the invention, the driver IC chip 200 is a thinned die and has, for example, a thickness of 50±10 μm (about 50 μm) in its smallest dimension. Additionally, the driver IC chip 200 can be thinned to 50 μm or less in height or between 100 μm and 20 μm in height. Optionally, a thermal management component 215, such as a heat spreader or heat sink, is in thermal contact with a surface of the laser chip 205. Optionally, a layer of a material, such as a thermal interface material (not shown), is between the thermal management component 215 and the laser chip 205. Optionally, the laser chip 205 comprises optical components 220 that steer light 221 out of the laser chip 205. Optical components 220 direct laser light from laser chip 205 and can be optics that turn the light 90 degrees, such as 45 degree mirrors. Electrically conducting pillars, bumps, pins, or posts 225 on laser chip 205 join up with corresponding electrically conducting pillars, bumps, pins, or posts 230 on driver chip 200 and electrically operably couple laser chip 205 with driver chip 200. Conducting pillars, bumps, pins, or posts 235 on laser chip 205 join up with conducting pillars, bumps, pins, or posts 240 on the packaging substrate 210 and operably electrically couple laser chip 205 with substrate 210. Conducting pillars, bumps, pins, or posts 225 and 235 are electrically connected and joined with corresponding conducting pillars, bumps, pins, or posts 230 and 240, respectively, through an optional solder material 245 and 247. In alternate embodiments, no solder material 245 and 247 is present and the conducting pillars, bumps, pins, or posts 225 and 235 are electrically connected and joined with corresponding conducting pillars, bumps, pins, or posts 230 and 240, respectively, through a thermocompression bonding, thermosonic bonding, and/or epoxy bonding process, for example.

The surface of laser chip 205 also comprises a chip-on-substrate dam 250. An underfill 255 is placed between substrate 210 and laser chip 205. Chip-on-substrate dam 250 aids in preventing the flow of underfill 255 into the optical overhang area 260 of laser chip 205 during an underfill fill process, such as, for example, a capillary underfill process.

In additional embodiments, the surface of the laser chip 205 comprises a chip-on-chip dam 270. An underfill layer 275 is placed between laser chip 205 and IC chip 100. The chip-on-chip dam 270 aids in preventing the flow of underfill 275 into unwanted areas during an underfill fill process, such as, for example, a capillary underfill process Optionally, packaging substrate 210 comprises a passivation layer 280 on a surface. Passivation layer 280 can comprise features 281 that provide boundaries for solder material and underfill layers. Features 281 can be, for example, raised regions, bumps, or pillars.

A connector 285 connects the package substrate 210 to board 290. The connector 285 is, for example, an electrical connector that allows the optoelectronic assembly package to be removably attached to the board 290, such as a LIF connector or a socket connector. Board 290 provides electrical connections to other IC devices, such as, for example, processors and/or memory and is, for example a printed circuit board or other type of motherboard or server board.

Figure 2B:
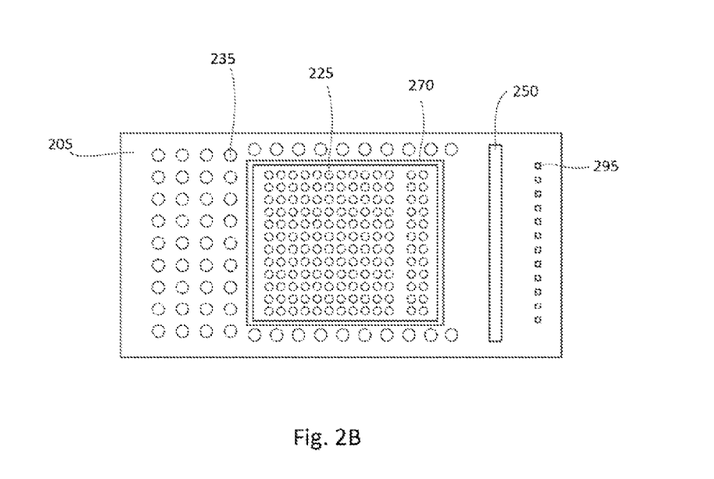

FIG. 2B is a view of a side of the laser chip 205 and the view does not include the IC chip 200 and the packaging substrate 210. In the view of FIG. 2B a larger number of conducting pillars 235 that join up with conducting posts 240 on the packaging substrate 210 have been provided. Additionally, in the view of FIG. 2B a larger number of conducting pillars 225 that join up with conducting posts 230 on the IC chip 200 have been provided. Other numbers conducting pillars 225 and 235 are also possible. The chip-on-substrate dam 250 and the chip-on-chip dam 270 are also visible in FIG. 2B. Optical transmission holes 295 allow laser light to exit laser chip 205. In embodiments of the invention, optical transmission holes 295 are vertically inverted taper holes.

Figure 3A:
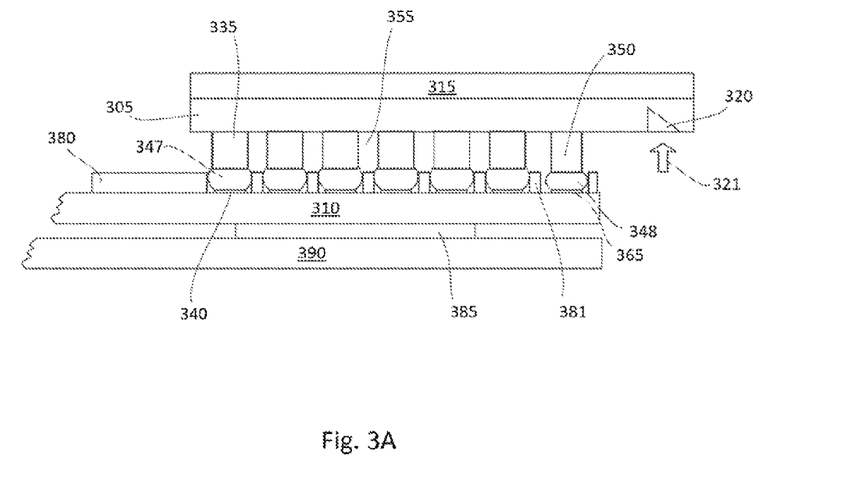
FIGS. 3A-B are schematic diagrams illustrating views of an optoelectronic packaging assembly employing an underfill dam.

FIG. 3A illustrates an additional optoelectronic packaging assembly in which a detector chip 305 (or die) is bonded to a package substrate 310. Optionally, a thermal management component 315, such as a heat spreader or a heat sink, is in thermal contact with a surface of the detector chip 305. Further optionally, a layer of a material, such as a thermal interface material (not shown) is between the thermal management component 315 and the detector chip 305. The detector chip 305 can comprise optional optical components 320 that steer light 321 into the one or more photodetectors (or photosensors) present in detector chip 305. Optical components 320 can be optics that turn light 90 degrees, such as 45 degree mirrors. Other numbers of optical components 320 are also possible. In further alternate embodiments, the laser light can enter the chip without being turned 90 degrees and it is possible that no mirrors are present. Electrically conducting pillars, bumps, pins, or posts 335 on detector chip 305 join up with conducting pillars, bumps, pins, or posts 340 on the packaging substrate 310 and operably electrically couple detector chip 305 with substrate 310. Conducting pillars, bumps, pins, or posts 335 are electrically connected and joined with corresponding conducting pillars, bumps, pins, or posts 340 through an optional solder material 347. In alternate embodiments, no solder material 347 is present and the conducting pillars, bumps, pins, or posts 335 are electrically connected and joined with corresponding conducting pillars, bumps, pins, or posts 340, respectively, through a thermocompression bonding, thermosonic bonding, and/or epoxy bonding process, for example.

The surface of detector chip 305 also comprises a chip-on-substrate dam 350. An underfill 355 is placed between substrate 310 and detector chip 305. Chip-on-substrate dam 350 aids in preventing the flow of underfill 355 into the optical overhang area 360 of detector chip 305 during an underfill fill process, such as, for example, a capillary underfill process. Chip-on-substrate dam 350 is optionally bonded to a corresponding metal region 365 of packaging substrate 310 through, for example, solder material 348. Other bonding materials are possible. Optional metal region 365 is not operably electrically connected to packaging substrate 310.

Optionally, packaging substrate 310 comprises a passivation layer 380 on a surface. Passivation layer 380 can comprise features 381 that provide boundaries for solder material and underfill layers. Features 381 can be, for example, raised regions, bumps, or pillars.

A connector 385 connects the package substrate 310 to board 390. The connector 385 is, for example, an electrical connector that allows the optoelectronic assembly package to be removably attached to the board 390, such as a LIF connector or a socket connector. Board 390 provides electrical connections to other IC devices, such as, for example, processors and/or memory and is, for example a printed circuit board or other type of motherboard or server board.

Figure 3B:
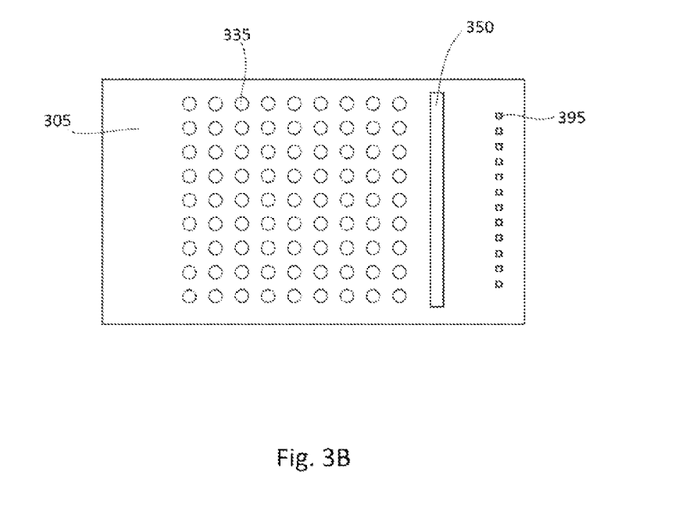

FIG. 3B is a view of a side of the detector chip 305 and the view does not include the packaging substrate 310. In the view of FIG. 3B a larger number of conducting pillars 335 that join up with conducting posts 340 on the packaging substrate 310 have been provided. Other numbers conducting pillars 335 are also possible. The chip-on-substrate dam 350 is also visible in FIG. 3B. Optical transmission holes 395 allow laser light to enter detector chip 305. In embodiments of the invention, optical transmission holes 395 are vertically inverted taper holes.

Figure 4A:
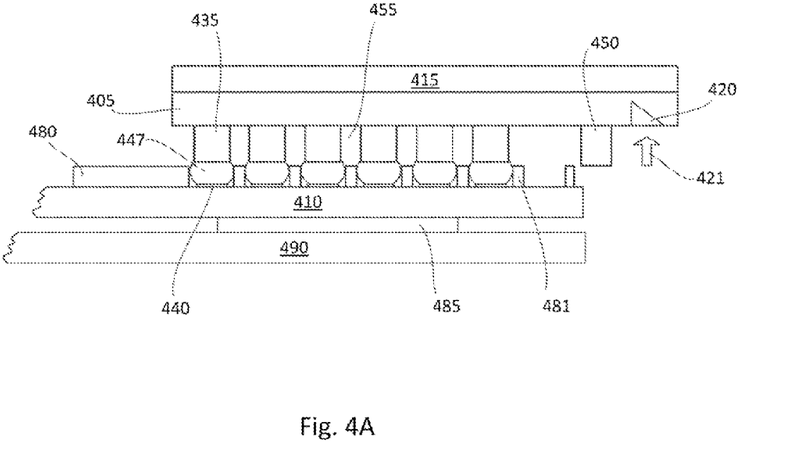
FIGS. 4A-B are schematic diagrams illustrating views of an additional optoelectronic packaging assembly employing an underfill dam.

FIG. 4A illustrates a further optoelectronic packaging assembly in which a detector chip 405 (or die) is bonded to a package substrate 410. Optionally, a thermal management component 415, such as a heat spreader or heat sink, is in thermal contact with a surface of the detector chip 405. Further optionally, a layer of a material, such as a thermal interface material (not shown) is between the thermal management component 415 and the detector chip 405. The detector chip 405 can comprise optical components 420 that steer light 421 into the one or more photodetectors (or photosensors) in detector chip 405. Optical components 420 can be optics that turn light 90 degrees, such as 45 degree mirrors. Other numbers of optical components 420 are also possible. In further alternate embodiments, the laser light can enter the chip without being turned 90 degrees and it is possible that no mirrors are present. Electrically conducting pillars, bumps, pins, or posts 435 on detector chip 405 join up with conducting pillars, bumps, pins, or posts 440 on the packaging substrate 410 and operably electrically couple detector chip 405 with substrate 410. Conducting pillars, bumps, pins, or posts 435 are electrically connected and joined with corresponding conducting pillars, bumps, pins, or posts 440 through an optional solder material 447. In alternate embodiments, no solder material 447 is present and the conducting pillars, bumps, pins, or posts 435 are electrically connected and joined with corresponding conducting pillars, bumps, pins, or posts 440, respectively, through a thermocompression bonding, thermosonic bonding, and/or epoxy bonding process, for example.

The surface of detector chip 405 also comprises a chip-on-substrate dam 450. An underfill 455 is placed between substrate 410 and detector chip 405. Chip-on-substrate dam 450 aids in preventing the flow of underfill 455 into the optical overhang area 360 of detector chip 405 during an underfill fill process, such as, for example, a capillary underfill process.

Optionally, packaging substrate 410 comprises a passivation layer 480 on a surface. Passivation layer 480 can comprise features 381 that provide boundaries for solder material and underfill layers. Features 481 can be, for example, raised regions, bumps, or pillars.

A connector 485 connects the package substrate 410 to board 490. The connector 485 is, for example, an electrical connector that allows the optoelectronic assembly package to be removably attached to the board 490, such as a LIF connector or a socket connector. Board 490 provides electrical connections to other IC devices, such as, for example, processors and/or memory and is, for example a printed circuit board or other type of motherboard or server board.

Figure 4B:
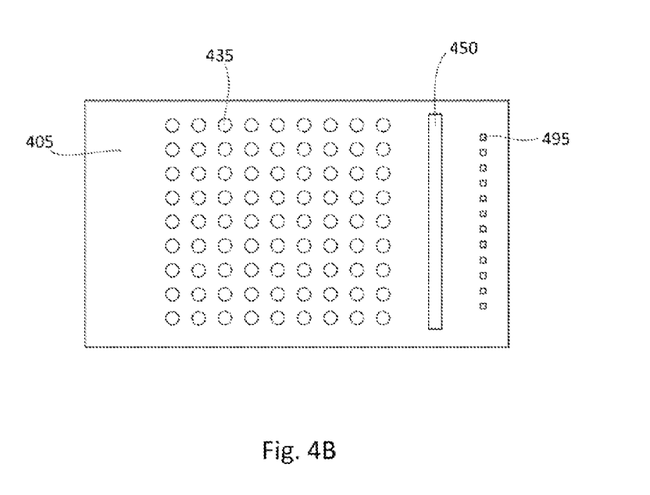

FIG. 4B is a view of a side of the detector chip 405 that is operably coupled to the packaging substrate 410. In the view of FIG. 4B a larger number of conducting pillars 435 that join up with conducting posts 440 on the packaging substrate 410 have been provided. Other numbers conducting pillars 435 are also possible. The chip-on-substrate dam 450 is also visible in FIG. 4B. Optical transmission holes 495 allow laser light to enter detector chip 405.

Figure 5:
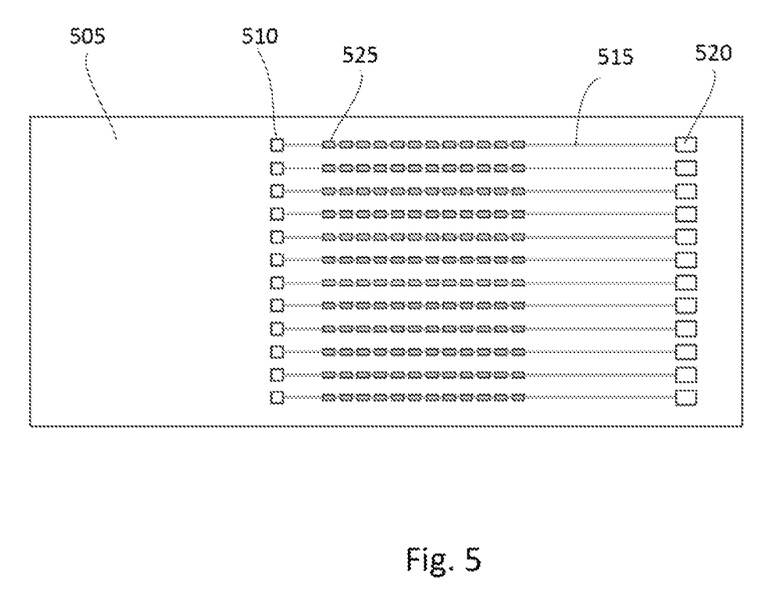
FIG. 5 is a schematic diagram of an optoelectronic laser chip.

FIG. 5 diagrams interior features of a laser chip 505. Laser chip 505 is comprised of lasers 510 and waveguides 515 that conduct light from lasers 510 to optional optical components 520. Optical components 520 direct laser light from laser chip 505 and can be optics that turn the light 90 degrees, such as 45 degree mirrors. Other numbers of optical components 520 are also possible. Laser light is output in a direction perpendicular to the direction the light travels though waveguides 515. In further alternate embodiments, the laser light can exit from the chip in a direction parallel to the direction light travels through waveguides 515. In embodiments of the invention, lasers 510 are, for example, vertical cavity surface emitting lasers (VCSELs), diode lasers, or hybrid semiconductor lasers. Hybrid semiconductor lasers are laser devices that comprise both silicon optical elements and light-emitting elements. The light-emitting elements can be, for example, comprised of indium phosphide. Although 12 lasers 510 are shown, other numbers of lasers 510 are possible. In embodiments of the invention, laser chip 505 comprises from 2 to 32 lasers. A plurality of optical modulators 525 are provided for each waveguide 515. In embodiments of the invention, 2 to 20, 5 to 15, or 7 to 15 optical modulators are provided for each waveguide 515.

Figure 6A:
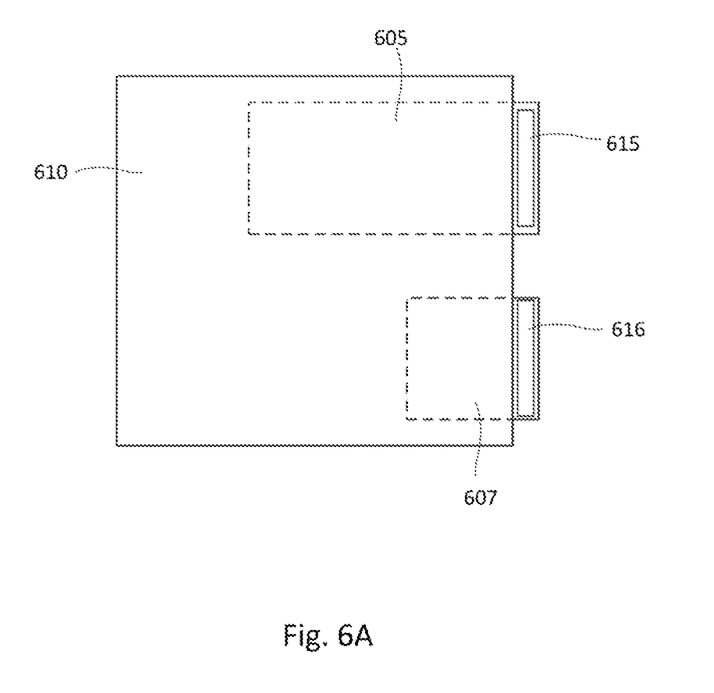
FIGS. 6A-B are schematic diagrams of an optoelectronic packaging assembly including lens(es).
Figure 6B:
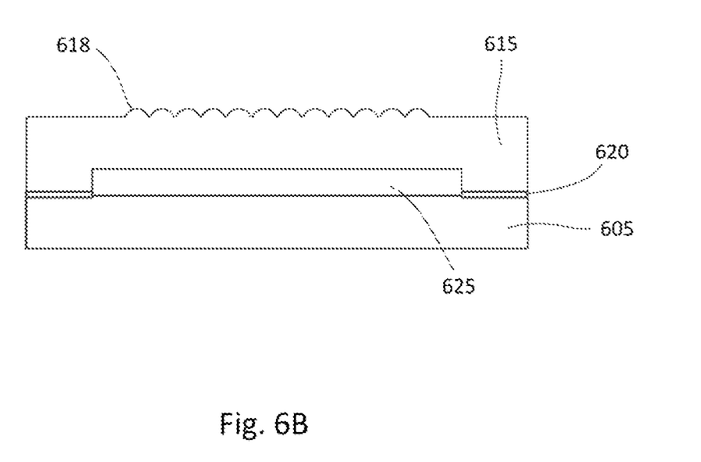

FIG. 6A illustrates the optical overhang region of an optoelectronic package assembly. The optical overhang region is the region of the optoelectronic chip that extends beyond the packaging substrate. Laser chip 605 and detector chip 607 are packaged on packaging substrate 610. The optical overhang areas of laser chip 605 and detector chip 607 allow attachment of lens pieces 615 and 616 for light input/output into one or more optical input/output coupling assemblies (not shown). The optical input/output coupling assembly (not shown) interconnects an optoelectronic assembly with, for example, fiber optic cables having connector assemblies on both ends that when connected to another device allow the device that an optoelectronic package is incorporated into to optically communicate (transfer data to and receive data from) the other device. In embodiments of the invention, lens pieces 615 and 616 comprise silicon. FIG. 6B is a view of a different side of an optoelectronic chip 605 and an attached lens 615 (the assembly is similar for optoelectronic chip 607 and lens piece 616). Lens pieces 615 and 616 comprise a plurality of lenses 618. Although twelve lenses 618 are shown, other larger or smaller numbers of lenses 618 are also possible. Optionally, the lenses 618 are part of a multi-lens array on lens pieces 615 and 616. The lenses 618 are aligned with laser chip 605 (or detector chip 607) vertically inverted taper holes, for light output (or input) and attached to laser chip 605 (or detector chip 607) through bonding material 620. In embodiments of the invention, the bonding material 620 is a low-temperature curable adhesive, such as a NCP (non-conductive paste) or NCF (non-conductive film) adhesive material. The bond between a lens piece 615 or 616 can be formed, for example, using a low-temperature curable adhesive through a thermo-compression bonding process using z-height control. In embodiments of the invention, the lens pieces 615 and 616 are provided with alignment fiducials that correspond to alignment fiducials on laser chip 605 or detector chip 607.

Figure 7:
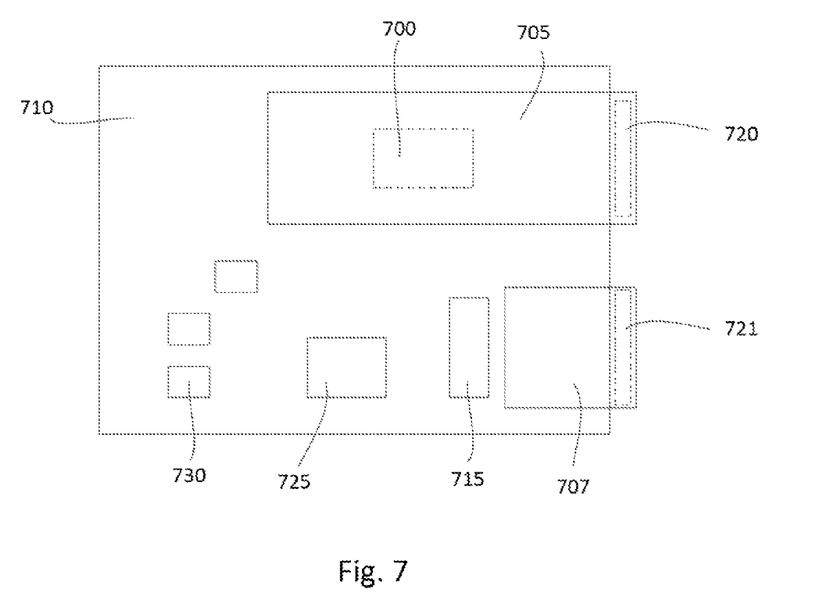
FIG. 7 is a schematic diagram of an optoelectronic packaging assembly.

FIG. 7 illustrates an optoelectronic package assembly in which a packaging substrate 710 comprises laser chip 705 and detector chip 707. A laser driver 700 is located between the packaging substrate 710 and the laser chip 705. The laser driver 700 is operably coupled to the laser chip 705. A receiver chip 715 is operably coupled to the detector chip 707 through the packaging substrate 710. The receiver chip 715 can comprise, for example, transimpedance amplifiers for each channel of data input. In general, a transimpedance amplifier (TIA) converts a current signal from a photodetector into a voltage signal and amplifies it. The receiver chip 715 can also comprise, a plurality of amplifiers in series (per transimpedance amplifier) that amplify the signals from the transimpedance amplifiers. Lens pieces 720 and 721 are attached to laser chip 705 and detector chip 707, respectively. A microcontroller chip 725 and bias IC dies 730 (for voltage regulation) are also provided on the packaging substrate. In alternate embodiments, some or all of the functions of the receiver chip 715 microcontroller chip 725 and bias IC dies 730 are combined into one die. In further alternate embodiments, the receiver chip 715 is directly connected to detector chip 707 in a stacking assembly in which the receiver chip 715 is not directly attached to the packaging substrate 710

Electrically conducting pillars, bumps, pins, or posts are comprised of a conducting material such as, for example, a metal such as copper, gold, aluminum, tungsten, platinum, or an alloy thereof. Electrical interconnections and metal-metal bonding between conducting pillars, pads, bumps, columns, pins, or other conducting structures, that are formed without solder, can be accomplished, for example, through thermocompression bonding, thermosonic bonding, and/or epoxy bonding of the chips. In embodiments of the invention, the pillars, pads, bumps, columns, pins, or other conducting structures can be comprised of gold or copper and thermocompression bonding is used to join them. Passivation layers can be comprised of, for example, $SiO_2$, SiN, and SiON. Underfill material can be, for example, flowable dielectric material, such as, for example, an epoxy with or without filler particles, or a polymer or inorganic material with or without filler particles.

A detector chip is a substrate comprising one or more photosensors or photodetectors. In embodiments of the invention the detector chip comprises a plurality of photodetectors, such as, for example, 2 to 32 photodetectors. Photosensors and photodetectors include, for example, avalanche photodiodes or PIN diodes.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Various additional layers and/or structures may be included and/or described features may be omitted in other embodiments.

We claim:

1. An assembly comprising:
   a packaging substrate;
   an optoelectronic chip electronically coupled to the packaging substrate, the optoelectronic chip including a surface in which circuitry is integrated to convert between optical and electrical signals, including an overhang portion to extend past an edge of the packaging substrate to overhang the packaging substrate;
   an optical coupler disposed in the overhang portion to couple light between the optoelectronic chip and an optical circuit, wherein the coupler is to change a direction of propagation of light to be orthogonal to the surface in which the circuitry is integrated;
   one or more structural features between the packaging substrate and the optoelectronic chip to provide a boundary for an underfill material, including one or more structural features integrated onto the optoelectronic chip; and
   an underfill material between the optoelectronic chip and the packaging substrate to fill space between the optoelectronic chip and the packaging substrate including between electrical contacts that electronically couple the optoelectronic chip to the packaging substrate, wherein the underfill material to be bounded by the one or more structural features to prevent flow of the underfill material to the portion to overhang the packaging substrate.

2. The assembly of claim 1, wherein the one or more structural features disposed proximate the overhang portion to prevent flow of the underfill past the edge of the packaging substrate.

3. The assembly of claim 1, further comprising a lens component disposed along a line of propagation of light between the coupler and the surface.

4. The assembly of claim 3, wherein the lens component comprises a plurality of lenses.

5. The assembly of claim 3, wherein the lens component comprises a silicon lens piece attached to the optoelectronic chip via a curable adhesive.

6. The assembly of claim 1, wherein the one or more structural features to be bonded to the packaging substrate.

7. The assembly of claim 1, further comprising a thermal management component in thermal contact with the optoelectronic chip.

8. The assembly of claim 1, wherein the optoelectronic chip comprises a laser chip to emit light.

9. The assembly of claim 8, wherein the laser chip includes an overhang portion to extend past an edge of the packaging substrate to overhang the packaging substrate, and wherein the laser chip is to emit light in a direction toward the packaging substrate from the overhang portion.

10. The assembly of claim 8, further comprising an integrated circuit chip coupled to the laser chip and disposed between the laser chip and the packaging substrate, the integrated circuit chip to process electrical signals corresponding to optical signals of the laser chip.

11. The assembly of claim 8, wherein the laser chip comprises multiple lasers.

12. The assembly of claim 1, wherein the optoelectronic chip comprises an optical detector chip to receive light input.

13. The assembly of claim 12, wherein the detector chip includes an overhang portion to extend past an edge of the packaging substrate to overhang the packaging substrate, and wherein the detector chip is to receive light from a direction of the packaging substrate into the overhang portion.

14. The assembly of claim 12, wherein the detector chip comprises multiple photodetector circuits.

15. An optoelectronic chip comprising:
a surface in which circuitry is integrated to convert between optical and electrical signals;
multiple conducting pillars on a surface of the optoelectronic chip to electrically couple to a packaging substrate;
an underfill barrier integrated on the surface of the optoelectronic chip, the underfill barrier to provide a boundary for an underfill material to be inserted between the optoelectronic chip and the packaging substrate, when coupled, the underfill barrier to be disposed proximate a portion of the optoelectronic chip to overhang the packaging substrate, when coupled;
wherein the underfill barrier to bound underfill material from extending to the portion of the optoelectronic chip to overhang the packaging substrate; and
an optical coupler disposed in the overhang portion to couple light between the optoelectronic chip and an optical circuit, wherein the coupler is to change a direction of propagation of light to be orthogonal to the surface in which the circuitry is integrated.

16. The optoelectronic chip of claim 15, further comprising a lens component disposed on the surface.

17. The optoelectronic chip of claim 15, wherein the optoelectronic chip comprises a laser chip to emit light from the portion of the optoelectronic chip to overhang the packaging substrate in a direction orthogonal to the surface in which the circuitry is integrated.

18. The optoelectronic chip of claim 17, further comprising an integrated circuit chip to be coupled to the laser chip and disposed between the laser chip and the packaging substrate, when coupled, the integrated circuit chip to process electrical signals corresponding to optical signals of the laser chip.

19. The optoelectronic chip of claim 15, wherein the optoelectronic chip comprises an optical detector chip to receive light input at the portion of the optoelectronic chip to overhang the packaging substrate.

* * * * *